(12) United States Patent
Hunsche et al.

(10) Patent No.: US 10,459,345 B2
(45) Date of Patent: Oct. 29, 2019

(54) FOCUS-DOSE CO-OPTIMIZATION BASED ON OVERLAPPING PROCESS WINDOW

(71) Applicant: ASML Netherlands B.V., Veldhoven (NL)

(72) Inventors: Stefan Hunsche, Santa Clara, CA (US); Chiou-Hung Jang, Pleasanton, CA (US); Marinus Jochemsen, Santa Clara, CA (US); Vito Tomasello, Mountain View, CA (US)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 15/553,106

(22) PCT Filed: Feb. 23, 2016

(86) PCT No.: PCT/EP2016/053742
§ 371 (c)(1),
(2) Date: Aug. 23, 2017

(87) PCT Pub. No.: WO2016/142169
PCT Pub. Date: Sep. 15, 2016

(65) Prior Publication Data
US 2018/0074413 A1    Mar. 15, 2018

Related U.S. Application Data

(60) Provisional application No. 62/129,405, filed on Mar. 6, 2015.

(51) Int. Cl.
G06F 17/50  (2006.01)
G03F 7/20   (2006.01)

(52) U.S. Cl.
CPC ...... G03F 7/70625 (2013.01); G03F 7/70125 (2013.01); G03F 7/70641 (2013.01)

(58) Field of Classification Search
CPC .................... G03F 7/70625; G03F 7/70125
(Continued)

(56) References Cited

U.S. PATENT DOCUMENTS 5,229,872 A   7/1993 Mumola
5,296,891 A   3/1994 Vogt et al.
(Continued)

FOREIGN PATENT DOCUMENTS

EP    1814143    8/2007

OTHER PUBLICATIONS

International Search Report and Written Opinion dated Jul. 8, 2016 in corresponding International Patent Application No. PCT/EP2016/053742.

*Primary Examiner* — Suchin Parihar
(74) *Attorney, Agent, or Firm* — Pillsbury Winthrop Shaw Pittman LLP

(57) ABSTRACT

A method to improve a lithographic process of processing a portion of a design layout onto a substrate using a lithographic apparatus, the method including: adjusting a first processing parameter among processing parameters of the lithographic process to cause the processing to be more tolerant to perturbations of at least one of the processing parameters during processing; and adjusting a second processing parameter among processing parameters of the lithographic process to cause the processing to be more tolerant to perturbations of at least one of the processing parameters during processing.

20 Claims, 10 Drawing Sheets

(58) Field of Classification Search
USPC .......................................................... 716/54
See application file for complete search history.

(56) References Cited

U.S. PATENT DOCUMENTS

| | | | |
|---|---|---|---|
| 5,523,193 | A | 6/1996 | Nelson |
| 6,046,792 | A | 4/2000 | Van Der Werf et al. |
| 7,026,082 | B2 | 4/2006 | Eurlings et al. |
| 7,921,383 | B1* | 4/2011 | Wei .................. G03F 7/705 |
| | | | 703/13 |
| 8,438,508 | B2 | 5/2013 | Liu |
| 2004/0137343 | A1 | 7/2004 | Eurlings et al. |
| 2006/0234144 | A1 | 10/2006 | Watson et al. |
| 2007/0050749 | A1* | 3/2007 | Ye ..................... G03F 1/44 |
| | | | 430/30 |
| 2009/0157360 | A1 | 6/2009 | Ye et al. |
| 2010/0162197 | A1* | 6/2010 | Ye ..................... G03F 1/144 |
| | | | 716/53 |
| 2011/0099526 | A1 | 4/2011 | Liu |
| 2014/0101625 | A1* | 4/2014 | Socha .............. G06F 17/50 |
| | | | 716/54 |
| 2014/0282291 | A1* | 9/2014 | Inoue ................ G03F 1/70 |
| | | | 716/52 |
| 2016/0299438 | A1* | 10/2016 | Mos ................ G06F 3/0482 |
| 2018/0046737 | A1* | 2/2018 | Willems ............ G03F 7/705 |
| 2018/0067900 | A1* | 3/2018 | Mos ............... G03F 7/70508 |
| 2018/0239851 | A1* | 8/2018 | Ypma ............... G06N 7/005 |
| 2018/0259858 | A1* | 9/2018 | Chen .............. G03F 7/70558 |

\* cited by examiner

FOCUS-DOSE CO-OPTIMIZATION BASED ON OVERLAPPING PROCESS WINDOW

CROSS-REFERENCE TO RELATED APPLICATIONS

This application is the U.S. national phase entry of PCT patent application no. PCT/EP2016/053742, which was filed on Feb. 23, 2016, which claims the benefit of priority of U.S. provisional application No. 62/129,405, which was filed on Mar. 6, 2015 and which is incorporated herein in its entirety by reference.

TECHNICAL FIELD

The present disclosure relates to a method of adjusting the performance of a device (e.g., semiconductor) manufacturing process. The method may be used in connection with a lithographic apparatus.

BACKGROUND

A lithographic apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

SUMMARY

Disclosed herein is a computer-implemented method to improve a lithographic process of processing or imaging a portion of a design layout onto a substrate using a lithographic apparatus, the method comprising: adjusting a first processing parameter among processing parameters of the lithographic process to cause the processing or imaging to be more tolerant to perturbations of at least one of the processing parameters during the processing or imaging; and adjusting a second processing parameter among processing parameters of the lithographic process to cause the processing or imaging to be more tolerant to perturbations of at least one of the processing parameters during the processing or imaging.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Figure 1:
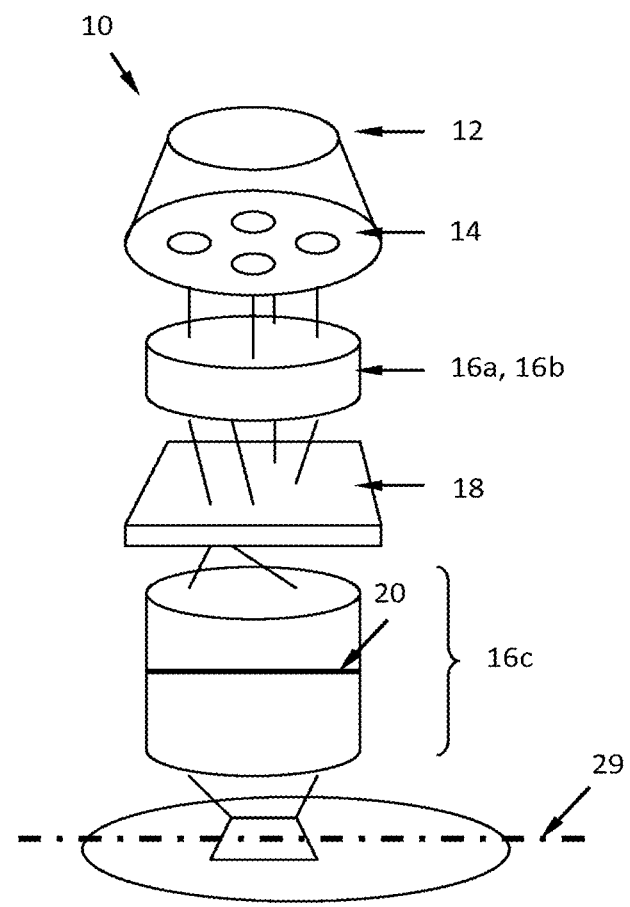
FIG. 1 is a block diagram of various subsystems of a lithography system according to an embodiment.

As a brief introduction, FIG. 1 illustrates an exemplary lithographic apparatus 10. Major components are an illumination source 12, which may be a deep-ultraviolet excimer laser source or other type of source such as an extreme ultra violet (EUV) source, illumination optics which define the partial coherence (denoted as sigma) and which may include optics 14, 16a and 16b that shape radiation from the source 12; a patterning device (e.g., a mask or reticle) 18; and optics 16c that project an image of the patterning device pattern onto a substrate plane 29. An adjustable filter or aperture 20 at the pupil plane of the projection optics may restrict the range of beam angles that impinge on the substrate plane 29, where the largest possible angle defines the numerical aperture of the projection optics $NA=\sin(\Theta_{max})$.

In a lithographic apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic apparatus (e.g., properties of the source, the patterning device and the projection optics) dictate the aerial image. Since the patterning device used in the lithographic apparatus can be changed, it is desirable to separate the optical properties of the patterning device from the optical properties of the rest of the lithographic apparatus including at least the source and the projection optics.

The term patterning device as employed in this text may be broadly interpreted as referring to a generic patterning device that can be used to provide a radiation beam having a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 2:
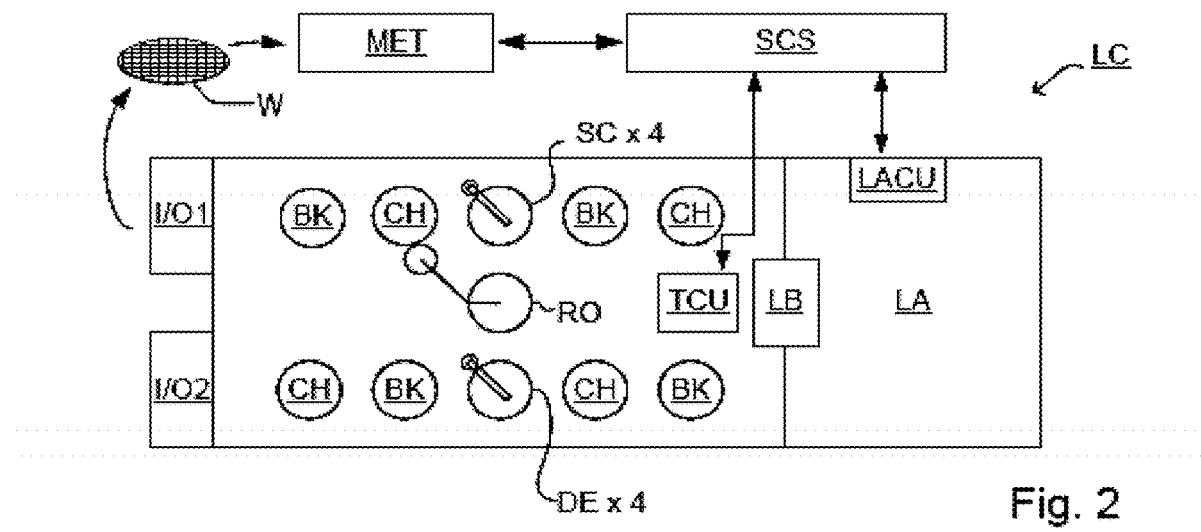
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), etc. Accordingly a manufacturing facility in which lithocell LC is located also typically includes a metrology/inspection system MET which receives some or all of the substrates W that have been processed in the lithocell. The metrology/inspection system MET may be part of the lithocell LC, for example it may be part of the lithographic apparatus LA.

Metrology/inspection results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology/inspection system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic apparatus or process such that results and/or processes of lithography or other processing have a more desirable characteristic, such as higher accuracy of projection of a design layout on a substrate, a larger process window, etc.

From a design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is desired. In other words, clips may be the portions of the design layout, or may be similar or have a similar behavior of portions of the design layout, where critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which should receive particular image optimization. Alternatively or additionally, in an embodiment, an initial larger set of clips may be extracted from the entire design layout by using some kind of automated (such as machine vision) or manual algorithm that identifies critical feature areas.

In an optimization process of a system, a figure of merit of the system may be represented as a cost function. The optimization process may then be a process of finding a set of parameters (design variables) of the system that, e.g., minimizes or maximizes the cost function. The cost function may have any suitable form depending on the goal of the optimization. For example, the cost function can be weighted root mean square (RMS) of deviations of certain characteristics (evaluation points) of the system with respect to the intended values (e.g., ideal values) of these characteristics; the cost function may also be the maximum of these deviations. The term "evaluation points" herein should be interpreted broadly to include any characteristics of the system. The design variables of the system can be confined to finite ranges and/or be interdependent due to practicalities of implementations of the system. In the case of a lithographic apparatus, the constraints are often associated with physical properties and/or physical characteristics of the hardware such as a tunable range and/or a patterning device manufacturability design rule, and the evaluation points can include one or more physical points on a resist image on a substrate and/or one or more non-physical characteristics such as dose and focus.

Examples of optimization methods can be found, for example, in U.S. Patent Application Publication No. US 2011-0099526, the disclosure of which is hereby incorporated by reference in its entirety.

Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce for a given time period. Various approaches can be employed to enhance the yield. One such approach attempts to make the production of devices (e.g., imaging a portion of a design layout onto a substrate using a lithographic apparatus) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In other words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
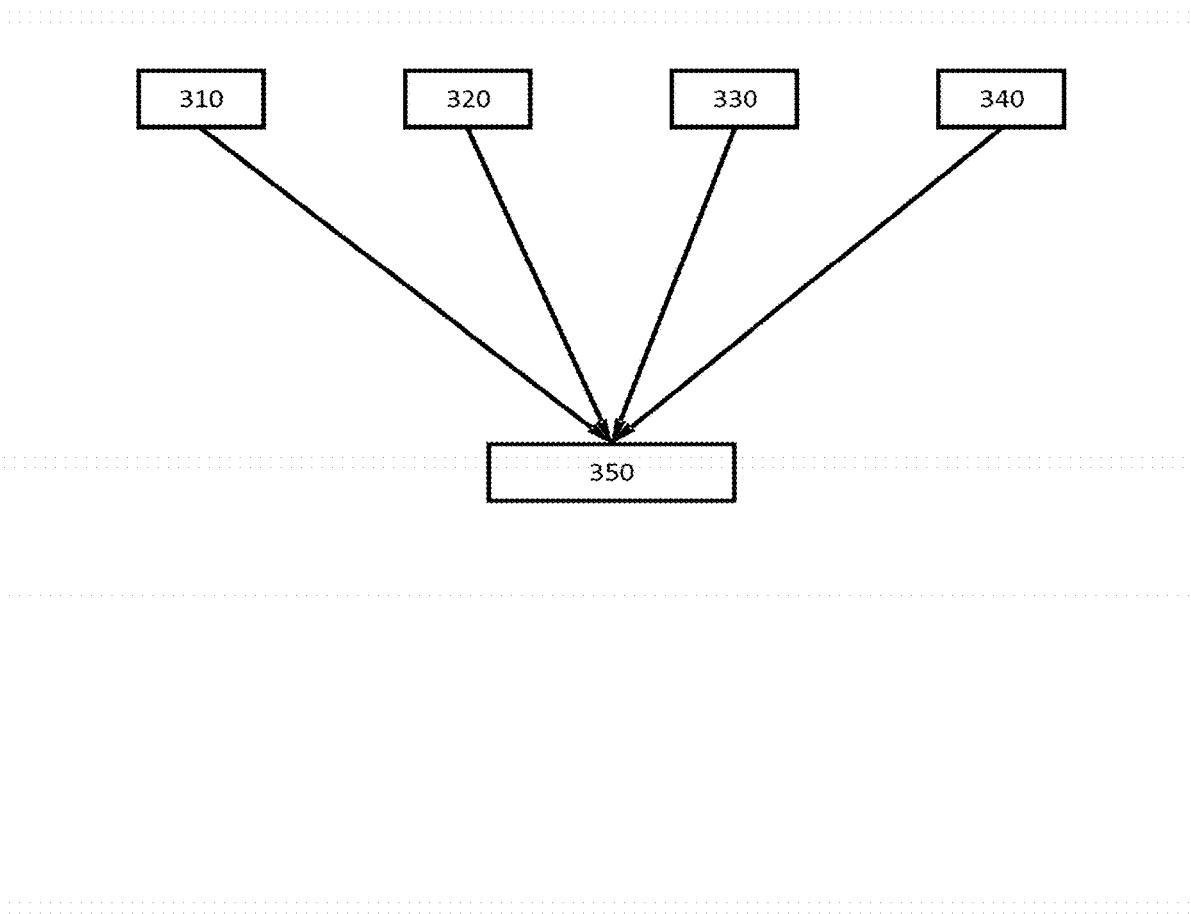
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
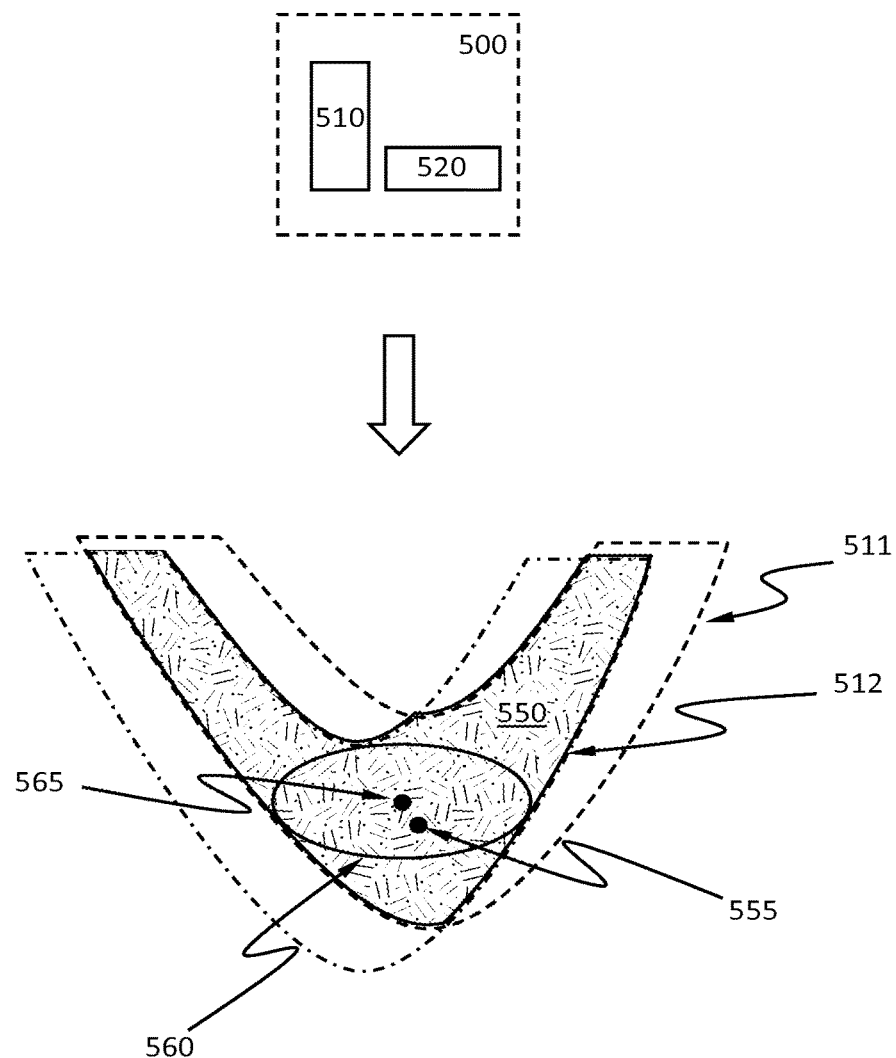
FIG. 4 schematically illustrates a concept of overlapping process window (OPW)

FIG. 4 schematically illustrates the concept of an OPW. To illustrate the concept, an area 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). Of course, the processing parameters may include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation. Sometimes, however, software or hardware limitations may prevent full compensation of a perturbation. For example, the substrate stage may be out of its movement range to compensate for the perturbation to the focus. Namely, these limitations make unreachable the point (e.g., point 555 or 565) that is as far away as possible from the boundary of the OPW or fitted OPW.

Figure 5A:
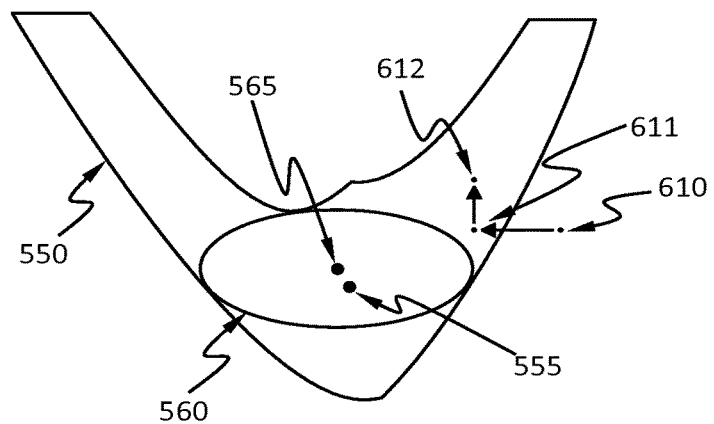
FIG. 5A schematically illustrates an example of a method of determining an alternative point in a processing parameter space that is as far away as possible under certain limitations from the boundary of a OPW or fitted OPW.

According to an embodiment, an alternative point in the processing parameter space that is as far away as possible under these limitations from the boundary of the OPW or fitted OPW may be determined instead, and imaging may be performed at the alternative point. FIG. 5A schematically illustrates an example of a method of determining the alternative point. In this example, the same OPW 550 and fitted OPW 560 are used. The point 555 is still the point that is as far away as possible from the boundary of the OPW 550, if no limitations exist on the adjustment of the processing parameters. The point 565 is still the point that is as far away as possible from the boundary of the fitted OPW 560, if no limitations exist on the adjustment of the processing parameters. In an example, perturbation during or before imaging causes the processing parameters to be at point 610. In an embodiment, software and/or hardware limitations prevent adjustment of focus (i.e., adjustment in the horizontal axis where focus is in the horizontal axis) from going to the left of point 611. Neither point 555 nor point 565 is reachable. Point 611 is quite close to the boundary of OPW 550 and outside the boundary of fitted OPW 560. Therefore, if imaging is performed at point 611, the imaging is not quite tolerant to perturbations of at least one of the processing parameters. Other processing parameters, such as the dose, can be adjusted (i.e., adjustment in the vertical axis where dose is in the vertical axis) to move the processing parameters from point 611 further away from the boundary of OPW 550, for example, to point 612 as the alternative point at which imaging may be performed. Imaging performed at point 612 is more tolerant to perturbations than imaging performed at point 611 although imaging performed at point 612 is not as tolerant to perturbations as imaging performed at point 565 or point 555. As explained above, the OPW is not limited to two processing parameters. Instead, the OPW may be defined over many processing parameters. Moving the processing parameters away from the boundary of the OPW by adjusting one processing parameter may make the imaging more tolerant to perturbations of another processing parameter. For example, in FIG. 5A, moving from point 611 to point 612 by adjusting the dose also gives more room to tolerate perturbation of the focus (i.e., point 612 is further away in the horizontal direction from the boundary of the OPW than point 611).

Figure 5B:
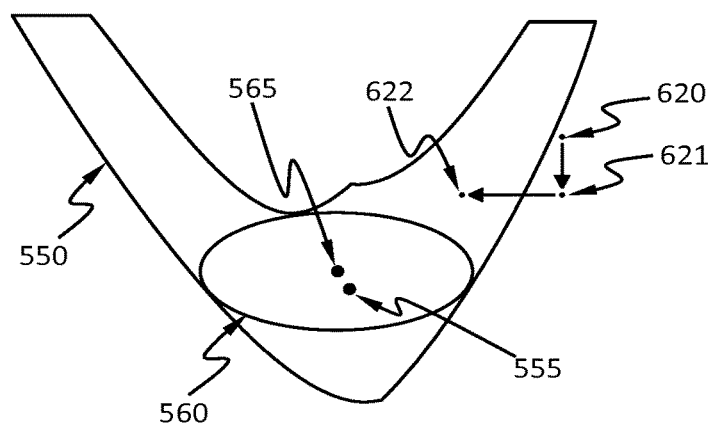
FIG. 5B schematically illustrates another example of a method of determining an alternative point in a processing parameter space that is as far away as possible under certain limitations from the boundary of a OPW or fitted OPW.

FIG. 5B schematically illustrates another example of a method of determining the alternative point. In this example, the same OPW 550 and fitted OPW 560 are used. The point 555 is still the point that is as far away as possible from the boundary of the OPW 550, if no limitations exist on the adjustment of the processing parameters. The point 565 is still the point that is as far away as possible from the boundary of the fitted OPW 560, if no limitations exist on the adjustment of the processing parameters. In an example, perturbation during or before imaging causes the processing parameters to be at point 620. In an embodiment, software and/or hardware limitations prevent adjustment of dose (i.e., adjustment in the vertical axis where dose is in the vertical axis) from going below point 621. Neither point 555 nor point 565 is reachable. Point 621 is outside the boundary of OPW 550 and outside the boundary of fitted OPW 560. Therefore, if imaging is performed at point 621, the imaging may cause one or more defects on the substrate. One or more other processing parameters, such as the focus, can be adjusted (i.e., adjustment in the horizontal axis if focus is in the horizontal axis) to move the processing parameters from point 621 into OPW 550 and away from its boundary, for example, to point 622 as the alternative point at which imaging may be performed. Imaging performed at point 622 may not cause a systematic defect although imaging performed at point 622 is not as tolerant to perturbations as imaging performed at point 565 or point 555.

Figure 6A:
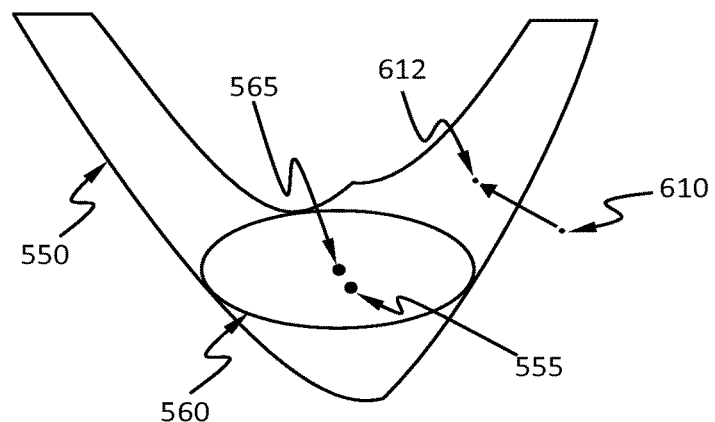
FIGS. 6A and 6B respectively show an example of simultaneous adjustment of focus and dose in the examples of FIG. 5A and FIG. 5B.
Figure 6B:
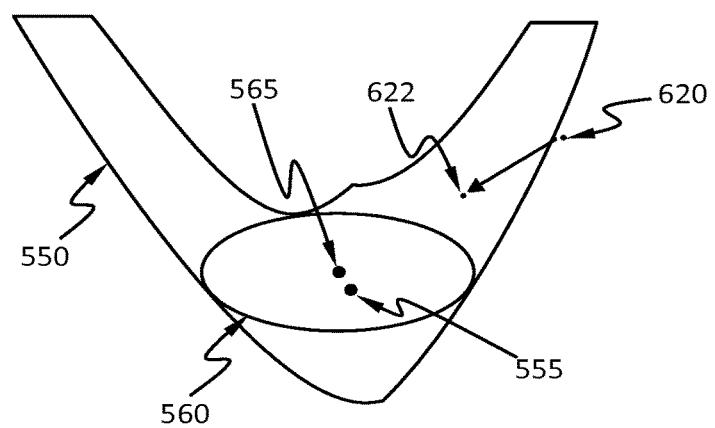

In FIG. 5A and FIG. 5B, the processing parameters are adjusted alternately. The processing parameters may be adjusted simultaneously. FIGS. 6A and 6B respectively show simultaneous adjustment of focus and dose in the examples of FIG. 5A and FIG. 5B.

The processing parameters can be adjusted using any suitable method. For example, a cost function that is a function of the processing parameters and measures distances of a point in the processing parameter space to the boundary of the OPW or fitted OPW can be calculated. For example, the cost function may be the smallest distance among the distances between a point inside the OPW to points on the boundary of the OPW. The alternative point 612 or 622 is a point in the processing parameter space that causes the cost function to e.g., reach a maximum value (or within 60%, 70%, 80%, 90% or 95% of the maximum value), subject to any software and/or hardware limitations. The alternative point 612 or 622 may be found using any suitable method such as the Gauss-Newton algorithm, the Levenberg-Marquardt algorithm, the gradient descent algorithm, simulated annealing, and/or the genetic algorithm.

Figure 7:
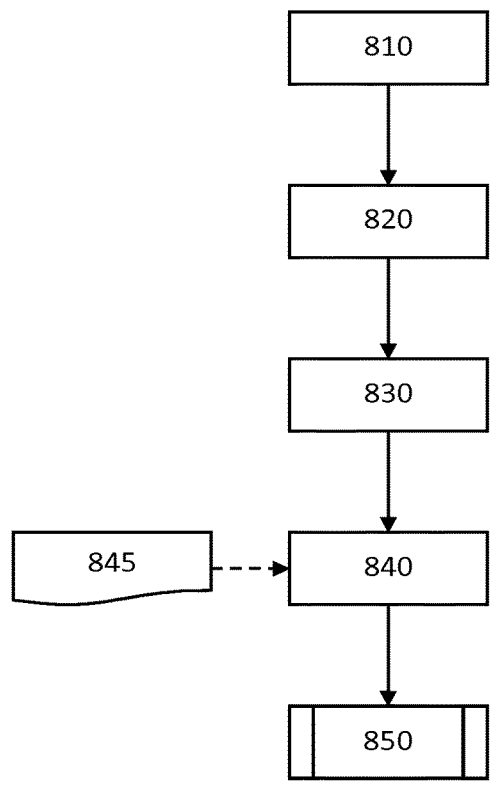
FIG. 7 shows an exposure flow to which the method of determining the alternative point in the processing parameter space can be applied.

FIG. 7 shows an imaging flow to which the method of determining the alternative point in the processing parameter space can be applied. In step 810, the lithographic apparatus to be used for the imaging is optimized or the design layout to be used for the imaging is optimized, or both. In step 820, the OPW or the fitted OPW is obtained for the entire design layout or for a portion thereof. In step 830, a point in the space of the processing parameters that is as far away as possible from the boundary of the OPW or fitted OPW is obtained. An example of such a point is point 555 or 565 in the example of FIG. 4. In step 840, deviations of the processing parameters from the point as far away as possible from the boundary of the OPW or fitted OPW are determined or perturbations to the processing parameters are determined, for example, from metrology data 845. In step 850, the alternative point is determined by adjusting the processing parameters using any of the method described herein. The processing parameters can be adjusted alternately or simultaneously.

In an embodiment, the OPW or the fitted OPW of an area may be obtained by finding the overlap between process windows of less than all patterns in a portion of the design layout. The less than all patterns may include all PWLPs in that portion. The patterns whose process windows are not used to obtain the OPW or fitted OPW may be less critical (i.e., more tolerant to perturbation of at least one of processing parameters) patterns. The OPW or the fitted OPW obtained by finding the overlap between process windows of less than all patterns in a portion of the design layout is as large as or bigger than the OPW or the fitted OPW obtained by finding the overlap between process windows of all patterns in the portion.

Figure 8:
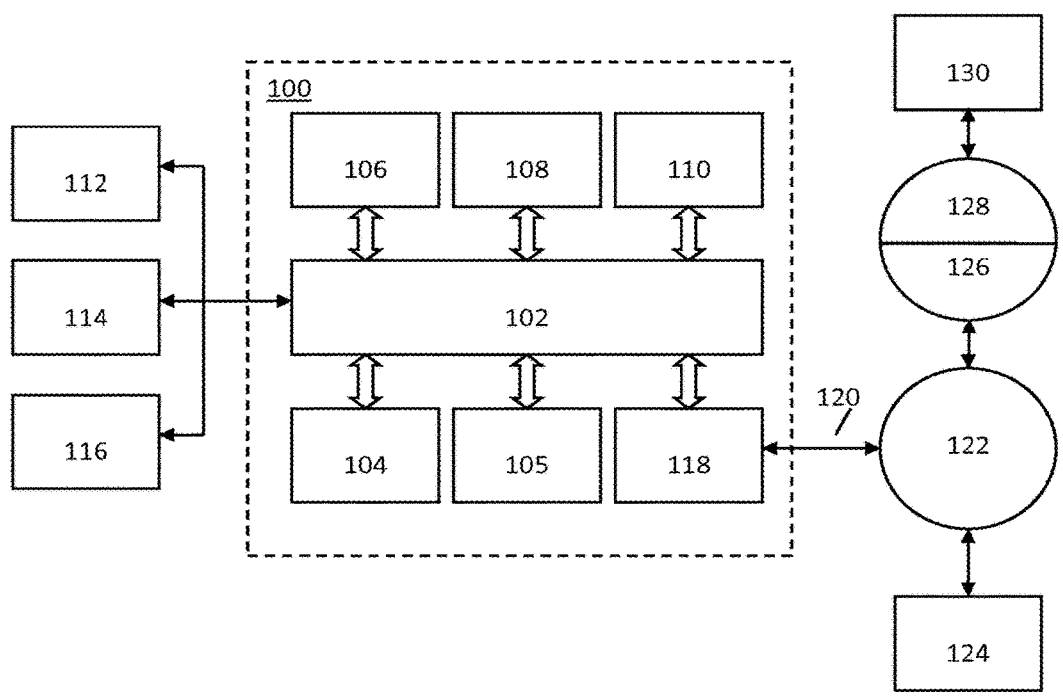
FIG. 8 is a block diagram of an example computer system in which embodiments can be implemented.

FIG. 8 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a communication line. Computer system 100 can receive the data on the line and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. Wired or wireless links may be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
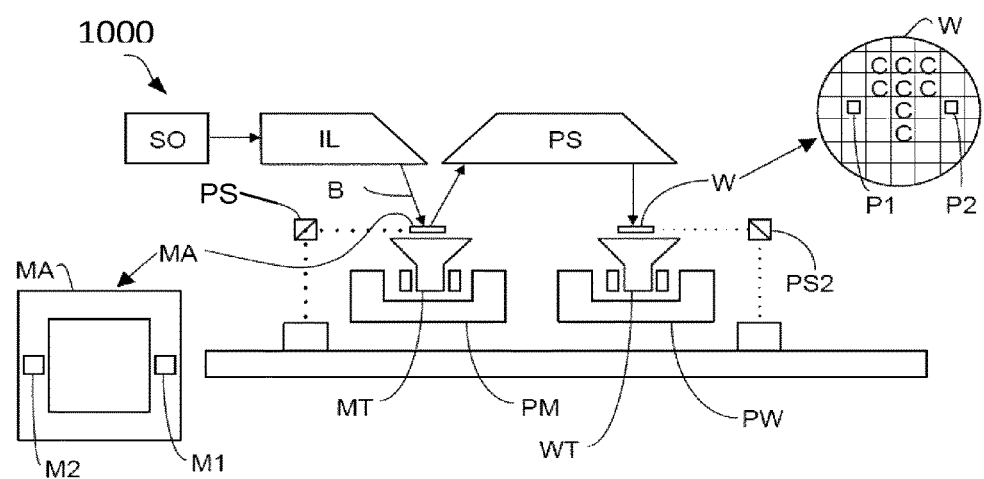
FIG. 9 is a schematic diagram of another lithographic apparatus.

FIG. 9 schematically depicts another exemplary lithographic apparatus 1000 whose illumination source could be optimized utilizing the methods described herein. The lithographic apparatus 1000 includes:

- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have multi-layer reflectors comprising, for example, a multi-stack of molybdenum and silicon. In one example, the multi-stack reflector has at least 40 layer pairs of molybdenum and silicon where the thickness of each layer is a quarter wavelength. Even smaller wavelengths may be produced with x-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
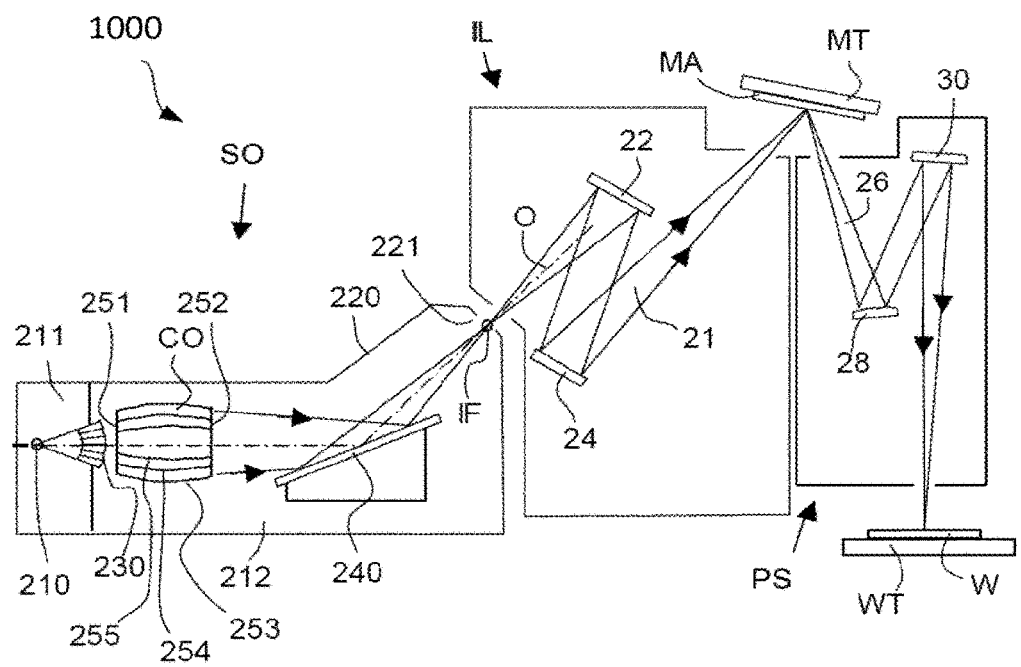
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in FIG. 10, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Alternatively, the source collector module SO may be part of an LPP radiation system. In such a system, a laser is arranged to deposit laser energy into a fuel, such as xenon (Xe), tin (Sn) or lithium (Li), creating the highly ionized plasma with electron temperatures of several 10's of eV. The energetic radiation generated during de-excitation and recombination of these ions is emitted from the plasma, collected by a near normal incidence collector optic and focused onto an opening in the enclosing structure.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A computer-implemented method of improving a lithographic process of imaging a portion of a design layout onto a substrate using a lithographic apparatus, the method comprising:
during or before the imaging, adjusting a first processing parameter among processing parameters of the lithographic process to cause the imaging to be more tolerant to perturbations of at least one of the processing parameters; and
during or before the imaging, adjusting a second processing parameter among processing parameters of the lithographic process to cause the imaging to be more tolerant to perturbations of at least one of the processing parameters.
2. The method of clause 1, wherein the first processing parameter is dose.
3. The method of clause 1 or clause 2, wherein the second processing parameter is focus.
4. The method of any of clauses 1 to 3, wherein the first and second processing parameters are adjusted alternately.
5. The method of any of clauses 1 to 4, wherein the first and second processing parameters are adjusted simultaneously.
6. The method of any of clauses 1 to 5, wherein causing the imaging to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from a boundary of the OPW if the values of the processing parameters are inside the OPW.
7. The method of clause 6, wherein the OPW is a fitted OPW.
8. The method of any of clauses 1 to 7, wherein a value of the first processing parameter is subject to one or more limitations.
9. The method of any of clauses 1 to 8, wherein the first processing parameter is focus and wherein adjusting the first processing parameter comprises moving or tilting the substrate.
10. The method of any of clauses 1 to 9, wherein adjusting the first processing parameter or the second processing parameter comprises calculating a cost function that is a function of the processing parameters and that measures distances of a point in a space of the processing parameters to the boundary of an overlapping process window (OPW) of the portion.
11. The method of clause 10, wherein adjusting the first processing parameter or the second processing parameter further comprises obtaining values of the processing parameters that minimize or maximize the cost function.
12. The method of clause 11, wherein the values of the processing parameters that minimize or maximize the cost function are obtained by the Gauss-Newton algorithm, the Levenberg-Marquardt algorithm, the gradient descent algorithm, simulated annealing, or the genetic algorithm.
13. The method of any of clauses 1 to 12, further comprising optimizing the lithographic apparatus.
14. The method of any of clauses 1 to 13, further comprising optimizing the portion of the design layout.
15. The method of any of clauses 1 to 14, further comprising obtaining an overlapping process window (OPW) of the portion or of an entirety of the design layout.
16. The method of any of clauses 1 to 15, further comprising obtaining a nominal condition.
17. The method of clause 16, further comprising determining deviations from the nominal condition.
18. The method of any of clauses 1 to 17, further comprising determining the perturbations.
19. A computer-implemented method to improve a lithographic process of imaging a portion of a design layout onto a substrate using a lithographic apparatus, the method comprising: during the imaging, adjusting a first processing parameter among processing parameters of the lithographic process to cause the imaging to be more tolerant to perturbations of at least one of the processing parameters; and
during the imaging, adjusting a second processing parameter among processing parameters of the lithographic process to cause the imaging to be more tolerant to perturbations of at least one of the processing parameters,
wherein causing the imaging to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from a boundary of the OPW if the values of the processing parameters are inside the OPW, and wherein the OPW is obtained by finding an overlap of process windows of at least some patterns in the portion.
20. The method of clause 19, wherein the at least some patterns are less than all patterns in the portion.
21. The method of clause 19 or clause 20, wherein the first processing parameter is dose.
22. The method of any of clauses 19 to 21, wherein the second processing parameter is focus.
23. The method of any of clauses 1 to 22, wherein adjusting the first processing parameter causes the imaging to be more tolerant to perturbations of another processing parameter different from the first processing parameter; or wherein adjusting the second processing parameter causes the imaging to be more tolerant to perturbations of another processing parameter different from the second processing parameter.
24. A computer-implemented method to improve a lithographic process of processing a portion of a design layout onto a substrate using a lithographic apparatus, the method comprising:
during the processing, adjusting a first processing parameter among processing parameters of the lithographic process to cause the processing to be more tolerant to perturbations of at least one of the processing parameters; and
during the processing, adjusting a second processing parameter among processing parameters of the lithographic process to cause the processing to be more tolerant to perturbations of at least one of the processing parameters.
25. The method of clause 24, wherein the first processing parameter is dose.
26. The method of clause 24 or clause 25, wherein the second processing parameter is focus.
27. The method of any of clauses 24 to 26, wherein the first and second processing parameters are adjusted alternately.
28. The method of any of clauses 24 to 27, wherein the first and second processing parameters are adjusted simultaneously.
29. The method of any of clauses 24 to 28, wherein causing the processing to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from the boundary of the OPW if the values of the processing parameters are inside the OPW.

30. The method of clause 29, wherein the OPW is a fitted OPW.

31. The method of any of clauses 24 to 30, wherein a value of the first processing parameter is subject to one or more limitations.

32. The method of any of clauses 24 to 31, wherein the first processing parameter is focus and wherein adjusting the first processing parameter comprises moving or tilting the substrate.

33. The method of any of clauses 24 to 32, wherein adjusting the first processing parameter or the second processing parameter comprises calculating a cost function that is a function of the processing parameters and that measures distances of a point in a space of the processing parameters to the boundary of an overlapping process window (OPW) of the portion.

34. The method of clause 33, wherein adjusting the first processing parameter or the second processing parameter further comprises obtaining values of the processing parameters that minimize or maximize the cost function.

35. The method of clause 34, wherein the values of the processing parameters that minimize or maximize the cost function are obtained by the Gauss-Newton algorithm, the Levenberg-Marquardt algorithm, the gradient descent algorithm, simulated annealing, or the genetic algorithm.

36. The method of any of clauses 24 to 35, further comprising optimizing the lithographic apparatus.

37. The method of any of clauses 24 to 36, further comprising optimizing the portion of the design layout.

38. The method of any of clauses 24 to 37, further comprising obtaining an overlapping process window (OPW) of the portion or of an entirety of the design layout.

39. The method of any of clauses 24 to 38, further comprising obtaining a nominal condition.

40. The method of clause 39, further comprising determining deviations from the nominal condition.

41. The method of any of clauses 24 to 40, further comprising determining the perturbations.

42. A computer-implemented method to improve a lithographic process of processing a portion of a design layout onto a substrate using a lithographic apparatus, the method comprising:
during the processing, adjusting a first processing parameter among processing parameters of the lithographic process to cause the processing to be more tolerant to perturbations of at least one of the processing parameters; and
during the processing, adjusting a second processing parameter among processing parameters of the lithographic process to cause the processing to be more tolerant to perturbations of at least one of the processing parameters,
wherein causing the processing to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from the boundary of the OPW if the values of the processing parameters are inside the OPW, and wherein the OPW is obtained by finding an overlap of process windows of at least some patterns in the portion.

43. The method of clause 42, wherein the at least some patterns are less than all patterns in the portion.

44. The method of clause 42 or clause 43, wherein the first processing parameter is dose.

45. The method of any of clauses 42 to 44, wherein the second processing parameter is focus.

46. The method of any of clauses 25 to 45, wherein adjusting the first processing parameter causes the processing to be more tolerant to perturbations of another processing parameter different from the first processing parameter; or wherein adjusting the second processing parameter causes the processing to be more tolerant to perturbations of another processing parameter different from the second processing parameter.

47. A computer program product comprising a computer readable medium having instructions recorded thereon, the instructions when executed by a computer implementing the method of any of the above clauses.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method of improving a lithographic process of imaging a portion of a design layout onto a substrate using a lithographic apparatus, the method comprising:
during or before the imaging, adjusting, by a hardware computer system, a first processing parameter among processing parameters of the lithographic process to cause the imaging to be more tolerant to perturbations of at least one of the processing parameters; and
during or before the imaging, adjusting, by the hardware computer system, a second processing parameter among processing parameters of the lithographic process to cause the imaging to be more tolerant to perturbations of at least one of the processing parameters,
wherein adjustment of the first processing parameter and/or of the second processing parameter is under a constraint on an amount of adjustment such that the adjusting of the first and second processing parameters cannot adjust the first and second processing parameters, at a particular time, to both their values that cause the imaging to be maximally tolerant to perturbations of the first and second processing parameters.

2. The method of claim 1, wherein the first processing parameter is dose, and/or wherein the second processing parameter is focus.

3. The method of claim 1, wherein the first and second processing parameters are adjusted alternately, or wherein the first and second processing parameters are adjusted simultaneously.

4. The method of claim 1, wherein causing the imaging to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from a boundary of the OPW if the values of the processing parameters are inside the OPW.

5. The method of claim 4, wherein the OPW is a fitted OPW.

6. The method of claim 1, wherein the first processing parameter is focus and wherein adjusting the first processing parameter comprises moving or tilting the substrate.

7. The method of claim 1, wherein adjusting the first processing parameter or the second processing parameter comprises calculating a cost function that is a function of the processing parameters and that measures distances of a point in a space of the processing parameters to the boundary of an overlapping process window (OPW) of the portion.

8. The method of claim 7, wherein adjusting the first processing parameter or the second processing parameter further comprises obtaining values of the processing parameters that minimize or maximize the cost function.

9. The method of claim 1, further comprising optimizing the lithographic apparatus, and/or further comprising optimizing the portion of the design layout.

10. The method of claim 1, further comprising obtaining an overlapping process window (OPW) of the portion or of an entirety of the design layout.

11. The method of claim 1, further comprising obtaining a nominal condition, and/or further comprising determining deviations from a nominal condition.

12. The method of claim 1, further comprising determining the perturbations.

13. The method of claim 1, wherein adjusting the first processing parameter causes the imaging to be more tolerant to perturbations of another processing parameter different from the first processing parameter; or wherein adjusting the second processing parameter causes the imaging to be more tolerant to perturbations of another processing parameter different from the second processing parameter.

14. A computer program product comprising a non-transitory computer readable medium having instructions therein, the instructions, upon execution by a computer system, configured to cause the computer system to at least:
during or before imaging of a lithographic process of imaging a portion of a design layout onto a substrate using a lithographic apparatus, adjusting a first processing parameter among processing parameters of the lithographic process to cause the imaging to be more tolerant to perturbations of at least one of the processing parameters; and
during or before the imaging, adjust a second processing parameter among processing parameters of the lithographic process to cause the imaging to be more tolerant to perturbations of at least one of the processing parameters,
wherein adjustment of the first processing parameter and/or of the second processing parameter is under a constraint on an amount of adjustment such that the adjustment of the first and second processing parameters cannot adjust the first and second processing parameters, at a particular time, to both their values that cause the imaging to be maximally tolerant to perturbations of the first and second processing parameters.

15. The computer program product of claim 14, wherein the first processing parameter is dose, and/or wherein the second processing parameter is focus.

16. The computer program product of claim 14, wherein the first and second processing parameters are adjusted alternately, or wherein the first and second processing parameters are adjusted simultaneously.

17. The computer program product of claim 14, wherein causing the imaging to be more tolerant to perturbations of at least one of the processing parameters comprises (1) causing values of the processing parameters to be closer to an overlapping process window (OPW) of the portion if the values of the processing parameters are outside the OPW, or (2) causing values of the processing parameters to be farther away from a boundary of the OPW if the values of the processing parameters are inside the OPW.

18. The computer program product of claim 14, wherein a value of the first processing parameter is subject to one or more limitations.

19. The computer program product of claim 14, wherein the instructions configured to adjust the first processing parameter or the second processing parameter are further configured to calculate a cost function that is a function of the processing parameters and that measures distances of a point in a space of the processing parameters to the boundary of an overlapping process window (OPW) of the portion.

20. A computer program product comprising a non-transitory computer readable medium having instructions therein, the instructions, upon execution by a computer system, configured to cause the computer system to at least:
during or before imaging a portion of a design layout onto a substrate using a lithographic process and a lithographic apparatus wherein the lithographic process has a nominal condition of first processing parameter of the lithographic process and a nominal condition of a second processing parameter of the lithographic process, adjust the first processing parameter to cause the imaging to be more tolerant to perturbations of at least one of a plurality of processing parameters of the lithographic process; and
during or before the imaging, adjust the second processing parameter to cause the imaging to be more tolerant to perturbations of at least one of the processing parameters,
wherein the first processing parameter is being adjusted to a value of the first processing parameter different than the nominal condition of the first processing parameter and/or the second processing parameter is being adjusted to a value of the second processing parameter different than the nominal condition of the second processing parameter.

* * * * *